United States Patent [19]

Derzawiec et al.

[11] 4,398,103

[45] Aug. 9, 1983

[54] ENABLING CIRCUITRY FOR LOGIC CIRCUITS

[75] Inventors: Edward Derzawiec; Wade H. Nelson, both of Mesa; Cleon Petty, Tempe, all of Ariz.

[73] Assignee: Motorola, Inc., Schaumburg, Ill.

[21] Appl. No.: 275,530

[22] Filed: Jun. 19, 1981

[51] Int. Cl.³ .................. H03K 19/20; H03K 3/288
[52] U.S. Cl. .................. 307/454; 307/456; 307/458; 307/470; 307/480
[58] Field of Search .............. 307/440, 445, 446, 454, 307/456–458, 470, 480, 592, 597, 601

[56] References Cited

U.S. PATENT DOCUMENTS

| | | | |
|---|---|---|---|
| 3,600,604 | 8/1971 | Thorn-Booth | 307/480 X |
| 3,716,728 | 2/1973 | Hachenburg | 307/457 X |
| 4,199,731 | 4/1980 | Taylor et al. | 307/456 X |
| 4,319,148 | 3/1982 | Malaviya | 307/458 X |
| 4,322,640 | 3/1982 | Fukushima et al. | 307/456 X |
| 4,334,157 | 6/1982 | Ferris | 307/480 X |

Primary Examiner—Stanley D. Miller
Attorney, Agent, or Firm—William E. Koch

[57] ABSTRACT

In order to reduce the time it takes on-chip circuitry to generate an internal enabling signal from an external clock signal and an external enabling signal, the external clock signal is applied directly to the non-inverting input of an $A\overline{B}$ gate. The output of the $A\overline{B}$ gate and an external enabling signal are provided to first and second inputs of a NOR gate the output of which represents the internal enabling signal which is fed back to the inverting input of the $A\overline{B}$ gate. Thus, the clock signal propagates through only two stages of delay rather than three as is the case with prior art enabling circuitry.

5 Claims, 3 Drawing Figures

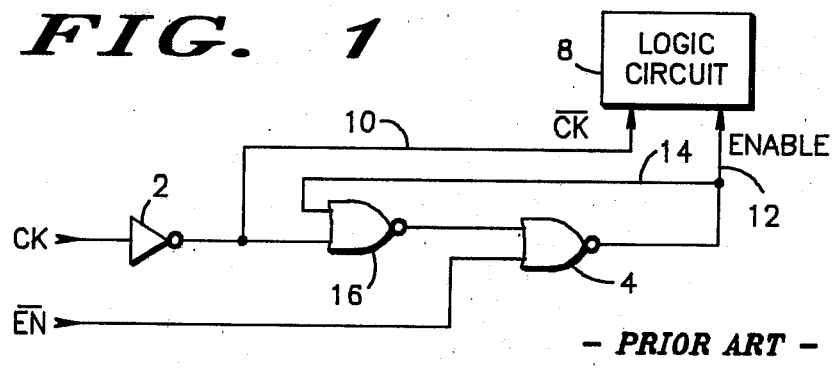
FIG. 1 — PRIOR ART —
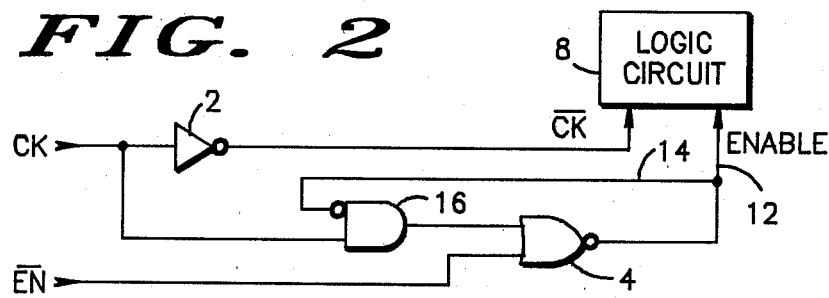
FIG. 2
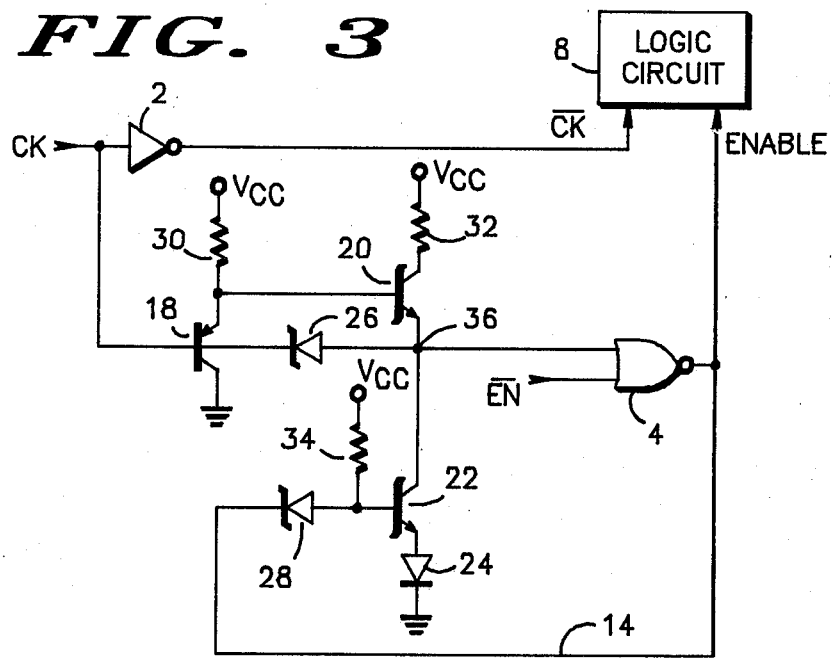
FIG. 3

ENABLING CIRCUITRY FOR LOGIC CIRCUITS

BACKGROUND OF THE INVENTION

1. Field of the Invention

This invention relates generally to enabling circuitry for logic circuits and, more particularly, to enabling circuitry for transistor-transistor logic (TTL) circuitry which utilizes the clock signal directly rather than after inversion to reduce the enabling delay without an associated power penalty.

2. Description of the Prior Art

Logic circuits such as data latches, flip-flops, shift registers, memories, etc. may require that an enabling signal be applied thereto in order to render the logic circuit operational. For example, the ALS377 hex data latch manufactured by Motorola Inc. requires the presence of such a signal.

Prior art enabling circuitry requires that an external clock signal (CK) propagate through three gates before the required enabling signal is produced. Thus, the enabling of the particular logic circuit involved is delayed by the propagation delay of the three gates. If the clock signal could be used directly rather than requiring inversion in the first of the three gates, there could be a significant improvement in enabling time.

SUMMARY OF THE INVENTION

It is an object of the present invention to provide improved circuitry for enabling logic circuits such as data latches, flip-flops, memories, shift registers and the like.

It is a further object of the present invention to provide enabling circuitry for logic circuits which provides faster enabling while at the same time consumes no additional power.

It is still a further object of the present invention to provide an improved $A\overline{B}$ gate; i.e., a gate wherein the output is high when a first input (A) thereof is high and a second input (B) thereof is low.

Finally, it is an object of the present invention to provide enabling circuitry for logic circuits which utilizes an improved $A\overline{B}$ gate.

According to a first aspect of the invention there is provided a logic circuit having at least first and second inputs and capable of assuming first and second inputs and capable of assuming first and second stable states at an output node thereof when said output node is coupled to a load, said first and second stable states corresponding to logical high and logical low voltages, said output node exhibiting said logical high voltage only when said first input is coupled to said logical high voltage and said second input is coupled to said logical low voltage, comprising: first buffer means having an input coupled to said first input and responsive to the voltage thereon; first transistor means having base, emitter and collector terminals, said base coupled to an output of said first buffer means for controlling said first transistor means, said collector adapted to be coupled to a first source of supply voltage, and said emitter coupled to said output node, said first transistor means for supplying current to said output node only when said first input is coupled to said logical high voltage; second buffer means coupled to said second input; and second transistor means having base, emitter and collector terminals, said base coupled to an output of said second buffer means, said collector coupled to said output node, and said emitter adapted to be coupled to a second source of supply voltage, said second transistor means for sinking current from said output node only when said second input is coupled to said logical high voltage.

According to a further aspect of the invention there is a circuit for generating an internal enabling signal from an external clock signal and an external enabling signal each capable of assuming high and low logic states, comprising: a first logic gate having a first input coupled to receive said external clock signal and a second input coupled to receive said internal enabling signal for generating a logical high output when said external clock signal is a logical high and said internal enabling signal is a logical low; and second logic means having a first input coupled to the output of said first logic gate and a second input coupled to receive said external enabling signal for generating said internal enabling signal.

The above and other objects, features and advantages of the present invention will be more clearly understood from the following detailed description taken in conjunction with the accompanying drawings, in which:

BRIEF DESCRIPTION OF THE DRAWINGS

FIG. 1 is a logic diagram of enabling circuitry in accordance with the prior art;

FIG. 2 is a logic diagram of enabling circuitry in accordance with the present invention; and FIG. 3 is a partial logic, partial schematic diagram of the inventive enabling circuitry.

DESCRIPTION OF THE PREFERRED EMBODIMENT

FIG. 1 is a block diagram of circuitry for enabling a logic circuit 8 in accordance with the prior art. As stated previously, logic circuit 8 may take a variety of forms; i.e., shift registers, data latches, memories, etc. As is shown, two inputs are provided to logic circuit 8. The first occurring on line 10 is the inverted clock signal $\overline{CK}$ which is produced at the output of inverter 2. The second input appears on line 12 and is the actual enable signal (ENABLE) produced by the enabling circuitry and appearing at the output of NOR gate 4. As described previously, the clock signal CK is applied to the input of an inverter 2 the output of which is coupled to an input of NOR gate 6. The actual enable signal (ENABLE) is applied to a second input of NOR gate 6 whose output is applied to a first input of NOR gate 4. An external enable signal ($\overline{EN}$) is applied to a second input of NOR gate 4.

In order to explain the operation of the circuitry shown in FIG. 1, the external enable signal $\overline{EN}$ is assumed to be in a low logic state initially. When the clock signal CK goes low at the input of inverter 2, a logical high is applied to a first input of NOR gate 6. Since a NOR gate exhibits a high output only if both inputs are low, the output of NOR gate 6 will be low. Since the external enable signal $\overline{EN}$ is also low, a logical high will be produced at the output of NOR gate 4 to enable logic circuit 8. The high signal appearing at the output of NOR gate 4 is fed back via line 14 to the second input of NOR gate 6 which latches the output of NOR gate 6 in the high state. Should the clock signal CK now go high, the output of NOR gate 6 will be maintained low, and as long as the external enable signal $\overline{EN}$ remains low, logic circuit 8 will be enabled.

It should be clear that the length of the time it takes the signal appearing at the output of NOR gate 4 to propagate back to the second input of NOR gate 6 is not critical since this is merely a feedback latching path. However, the fact that the clock signal CK must propagate through inverter 2 to the first input of NOR gate 6 undesirably increases the time it takes to initially produce the final enabling signal (ENABLE) on line 12.

FIG. 2 is a logic diagram of the inventive enabling circuitry. As can be seen, the clock signal $\overline{CK}$ is still applied to an input of inverter 2 the output of which (CK) is applied to logic circuit 8. Further, the external enable signal $\overline{EN}$ is still applied to a first input of NOR gate 4 the output of which represents the actual logic circuit enable signal (ENABLE) on line 12. The significant differences are that the clock signal CK is applied directly to a first input of $\overline{AB}$ gate. The second input of gate 16 is coupled via line 14 to the output of NOR gate 4 (ENABLE).

To illustrate that the circuits of FIGS. 1 and 2 are functionally equivalent, it is only necessary to show that the logical signal appearing at the second input of NOR gate 4 is the same in both cases. In FIG. 1, the output of NOR gate 6 takes the form $\overline{A}\,\overline{B}$ if signals A and B are supplied to the first and second inputs thereof. Therefore, the actual output of NOR gate 6 in FIG. 1 is $\overline{CK}\,\overline{ENABLE}$. The output of gate 16 in FIG. 2 takes the form $A\overline{B}$ if A is applied to the non-inverting input and B is applied to the inverting input. Thus, the actual output of $A\overline{B}$ gate 16 is $CK\,\overline{ENABLE}$. Since the outputs of NOR gate 6 in FIG. 1 and $A\overline{B}$ gate 16 are each applied to an input of a NOR gate 4 the second input of which is coupled to $\overline{EN}$, the circuits are functionally equivalent. It can be seen, however, as will be further described hereinbelow, that the clock signal must propagate through one less stage of delay in FIG. 2 thereby producing a significant speed improvement in producing the actual enabling signal (ENABLE). The clock signal is applied directly to gate 16. The inversion has been placed in feedback latching path 14 where timing is not critical.

FIG. 3 illustrates the details of $A\overline{B}$ gate 16 of FIG. 2. It includes PNP transistor 18, Schottky transistors 20 and 22, diode 24, Schottky diodes 26 and 28 and resistors 30, 32 and 34. The base of transistor 18 and the cathode of diode 26 are directly coupled to the clock signal CK. The collector of transistor 18 and the cathode of diode 24 are coupled to ground. The emitter of transistor 18 is coupled to a source of supply voltage $V_{CC}$ via resistor 30 and to the base of transistor 20. The collector of transistor 20 is coupled to the source of supply voltage $V_{CC}$ via resistor 32, and the emitter of transistor 20 is coupled to the collector of transistor 22, to the anode of diode 26, and to the second input of NOR gate 4. The emitter of transistor 22 is coupled to the anode of diode 24. The base of transistor 22 is coupled to the source of supply voltage $V_{CC}$ via resistor 34 and to the anode of diode 28. Schottky diode 26 provides a discharge path for the parasitic capacitance associated with the base-emitter junction of transistor 20 when the clock signal CK is low.

The $A\overline{B}$ function ($CK\,\overline{ENABLE}$) actually appears at node 36. That is, when the clock signal (CK) is high, transistor 18 remains off and transistor 20 is turned on. Current then flows from $V_{CC}$ through resistor 32 into node 36. If ENABLE is low, current flows from $V_{CC}$ through resistor 34 and through diode 28. Base drive is not supplied to transistor 22 maintaining it off. Since transistor 22 is off, it sinks no current from node 36 and therefore the voltage at node 36 rises to a logical high level. All other combinations of CK and ENABLE will result in a logical zero at node 36. That is, it has already been shown that when the clock signal CK is high, current flows into node 36. If, however, ENABLE is high, transistor 22 is turned on sinking current away from node 36 and causing it to go to a logical low level. If, on the other hand, the clock signal goes low, transistor 18 turns on diverting base current away from transistor 20 causing it to remain off. Therefore, no current is supplied to node 36 regardless of the state of the ENABLE line. Thus the voltage at node 36 will not rise to a logical high level.

It is true that the same functional relationship as that shown in FIG. 2 can be achieved by replacing the $A\overline{B}$ gate 16 with an AND gate and placing an inverter in the latching feedback line 14. While this would apparently offer a speed improvement, the additional inverter in feedback line 14 would consume additional power. Using the circuit shown in FIG. 3, a speed improvement of 55 percent has been achieved with no significant increase in power consumption.

The above description is given by way of example only. Changes in form and details may be made by one skill in the art without departing from the scope of the invention as defined by the appended claims. For example, the Schottky transistors and diodes shown in FIG. 3 may be replaced by traditional bipolar transistors and diodes. While the resultant circuit would not be as fast as that shown in FIG. 3, it would nevertheless be faster than the prior art circuit configured with traditional bipolar transistors and diodes.

Further, additional transistors and/or diodes could be added to increase the number of asserted or inverted inputs to the gate to expand its functionality.

We claim:

1. A logic circuit having at least first and second inputs and capable of assuming first and second stable states at an output node thereof when said output node is coupled to a load, said first and second stable states corresponding to logical high and logical low voltages, said output node exhibiting said logical high voltage only when said first input is coupled to said logical high voltage and said second input is coupled to said logical low voltage, comprising:

first buffer means having an input coupled to said first input and responsive to the first voltage thereon, said first buffer means comprising a PNP transistor having base, emitter and collector terminals, said base coupled to said first input, and said collector adapted to be coupled to a first source of supply voltage; and a first resistor having a first end coupled to the emitter of said PNP transistor and a second end adapted to be coupled to a second source of supply voltage;

first transistor means having base, emitter and collector terminals, for supplying current to said output node only when said first input is coupled to said logical high voltage, said first transistor means comprising a first Schottky transistor having a base coupled to the emitter of said PNP transistor, an emitter coupled to said output node, and a collector; and a second resistor having a first end coupled to the collector of said first Schottky transistor and a second end adapted to be coupled to said second source of supply voltage;

second buffer means coupled to said second input, said second buffer means comprising a Schottky diode having an anode and a cathode coupled to said second input; and second transistor means having base, emitter and collector terminals for sinking current from said output node only when said second input is coupled to said logical high voltage, said second transistor means comprising; a second Schottky transistor having a base coupled to the anode of said Schottky diode, a collector coupled to said output node, and an emitter adapted to be coupled to said first source of supply voltage; and a third resistor having a first end coupled to the base of said second Schottky transistor and a second end adapted to be coupled to said second source of supply voltage.

2. A logic circuit according to claim 1 further including a first diode having an anode coupled to said output node and a cathode coupled to said first input.

3. A logic circuit according to claim 2 wherein said first diode is a Schottky diode.

4. A logic circuit according to claim 2 further including a second diode having an anode coupled to the emitter of said second Schottky transistor and having a cathode adapted to be coupled to said first source of supply voltage.

5. A circuit for generating an internal enabling signal from an external clock signal and an external enabling signal each capable of assuming high and low logic states, comprising:

a first logic gate having a first input coupled to receive said external clock signal and a second input coupled to receive said internal enabling signal for generating a logical high output when said external clock signal is a logical high and said internal enabling signal is a logical low, said first logic gate capable of assuming first and second stable states at an output node thereof, said first and second states corresponding to logical high and logical low voltage levels, said first logic gate comprising:

first buffer means having an input coupled to said external clock signal;

first transistor means having base, emitter and collector terminals, said base coupled to an output of said first buffer means for controlling said first transistor means, said collector adapted to be coupled to a first source of supply voltage, and said emitter coupled to said output node, said first transistor means for supplying current to said output node only when said external clock signal is a logical high;

second buffer means coupled to receive said internal enabling signal; and second transistor means having base, emitter and collector terminals, said base coupled to an output of said second buffer means, said collector coupled to said output node and said emitter adapted to be coupled to a second source of supply voltage, said second transistor means for sinking current from said output node only when said internal enabling signal is a logical high;

a NOR gate having a first input coupled to the output of said first logic gate and a second input coupled to receive said external enabling signal for generating said internal enabling signal; and an inverter having an input coupled to receive said external clock signal and having an output for producing an internal inverted clock signal.

* * * * *